United States Patent [19]
Lee

[11] Patent Number: 5,825,103
[45] Date of Patent: Oct. 20, 1998

[54] VOLTAGE-SUPPRESSED VOLTAGE SOURCE WITH PARTIAL RESONANCE CIRCUIT

[75] Inventor: Kyung Geun Lee, Kyungki-do, Rep. of Korea

[73] Assignee: Samsung Electronics Co., Ltd., Kyungki-do, Rep. of Korea

[21] Appl. No.: 864,686

[22] Filed: May 28, 1997

[30]        Foreign Application Priority Data

May 31, 1996 [KR] Rep. of Korea ...................... 96 19368
Aug. 5, 1996 [KR] Rep. of Korea ...................... 96 32670

[51] Int. Cl.⁶ ................................................. H02M 3/335
[52] U.S. Cl. ......................... 307/130; 307/125; 323/235; 363/25; 363/26
[58] Field of Search .................................... 307/130, 125, 307/116; 323/234, 235; 363/25, 26, 21, 97

[56] References Cited

U.S. PATENT DOCUMENTS

| | | | |
|---|---|---|---|
| 4,371,917 | 2/1983 | Bator | 363/21 |
| 4,893,227 | 1/1990 | Gallios et al. | 363/26 |
| 5,180,964 | 1/1993 | Ewing | 323/235 |
| 5,615,093 | 3/1997 | Nalbant | 363/25 |

*Primary Examiner*—Jeffrey A. Gaffin
*Assistant Examiner*—Albert W. Paladini
*Attorney, Agent, or Firm*—Sughrue, Mion, Zinn, Macpeak & Seas, PPLC

[57] ABSTRACT

A voltage-suppressed voltage source which uses switching devices to maintain a high performance, stable DC voltage by suppressing unstable DC voltages and providing a stable supply of power to a load. The voltage source has a partial resonance circuit for reducing power consumed while a switching device in the voltage source turns 'on' and 'off'.

When a first switching device is off, unsuppressed DC voltages are stored in a resonance capacitor. When the first switching device is turned on, a resonance current flows from the resonance capacitor through a resonance coil and a second switching device just before the first switching device is turned on. This resonance current also induces a suppression effect to the output voltage, and allows the voltage suppressing portion to pass a current in the same direction as when the first switching device is on.

7 Claims, 5 Drawing Sheets

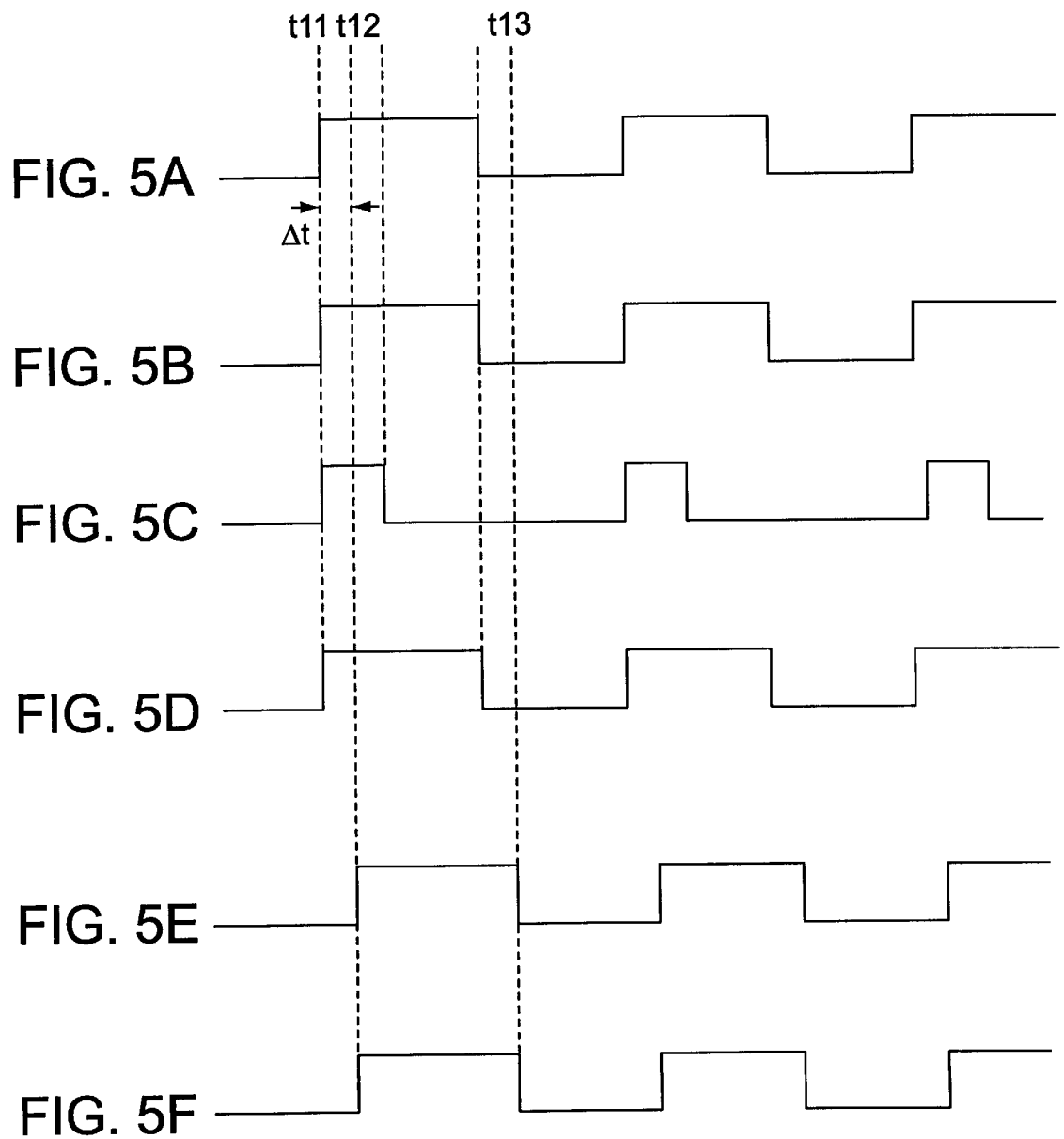

VOLTAGE-SUPPRESSED VOLTAGE SOURCE WITH PARTIAL RESONANCE CIRCUIT

BACKGROUND OF THE INVENTION

1. Field of the Invention

The present invention relates to a voltage-suppressed voltage source having a partial resonance circuit, which reduces power consumed during transistor switching periods, and maintains a high performance stable DC voltage by suppressing unstable DC voltages and providing stable power to a load.

2. Description of the Related Art

Electronic systems such as a computers, monitors televisions, etc. all consist of a voltage source in order to provide an operating voltage to a load. If the voltage source supplies a voltage that is higher than a rated voltage for the connected load, the system can be damaged. However, if the voltage supplied is lower than the rated voltage of the load, the circuit will not likely function properly. Therefore, stability is a critical requirement for a voltage source.

FIG. 1 is a circuit diagram showing an example of a conventional voltage-suppressed voltage source which is intended to provide a stable reference voltage source to the load. As shown in FIG. 1, DC voltage generating portion 1 converts an input voltage Vin to an arbitrary DC voltage VI. Voltage suppressing portion 3 contains a switching circuit which is used for switching and suppressing the DC voltage source V1, and for providing an output voltage Vout to a load. The switching circuit is controlled according to the control signal from the control portion 5.

Control portion 5 handles the switching operation of the voltage suppressing portion 3 according to the level of the output voltage Vout across the load. In the DC voltage generating portion 1, the input voltage source Vin is applied to the bridge diode BD1, which has capacitor 1 connected between its output node and ground.

In the voltage suppressing portion 3, the DC voltage V1 is applied to the drain of the switching MOSFET FET1. The source of the MOSFET FET1 is connected to the cathode of the flywheel diode D1, and the anode of the flywheel diode D1 is grounded. The other node of coil L1 is tied to capacitor C3, and the output voltage Vout which is supplied to the load, is taken from the same node.

Control portion 5 contains a pulse-width-modulated (PWM) controller, which generates a PWM signal according to the level of the output voltage Vout and a switching device driver 53, which turns FET1 on and off according to the output signal of the PWM controller.

The DC voltage V1 is suppressed through FET1, transformed to a different level of DC voltage through the flywheel diode D1, coil L1 and capacitor C3, and applied to the load as Vout. Vout is then fed back to the control portion 5 of the PWM controller 51. The width of the PWM signal on the PWM controller is varied according to the level of the output voltage Vout from the voltage suppressing portion 3. For example, if the level of Vout is higher than the previously established reference voltage, then the PWM controller 51 will generate a PWM signal with a narrow width. On the other hand, if Vout is lower than the previously established reference voltage, then the PWM controller 51 will generate a PWM signal with a wide width.

The PWM signal of the PWM controller 51 will be driven up to a level high enough to turn on FET1 by the switching device driver 53, and will be applied to the gate of FET1. Therefore, FET1 is turned on and off according to the output signal of the switching device driver 53.

If FET1 is turned on, the DC voltage VI essentially passes through FET1. Consequently, it is accumulated in the coil L1, transformed to DC voltage of an established level through the capacitor C3, and supplied to the load as an output voltage Vout. This will cause a reverse bias to be applied to flywheel diode D1, and which will turn diode D1 off.

When FET1 is turned off, a forward bias is applied to flywheel diode D1, and a counter-electromotive force is supplied in coil L1. When flywheel diode D1 is turned on and a closed loop is established comprising flywheel diode D1, coil L1 and capacitor C3, the charge accumulated in the coil L1 will start to discharge, resulting in an arbitrary level of Vout.

The level of the output voltage Vout is determined according to the level of the DC voltage V1 and the duty ratio (DR) of the PWM signal from PWM controller 51. The DR is expressed as follows:

$$Vout = V1 \times DR \qquad \text{I}$$

where DR is the duty ratio of the PWM signal. If the output voltage Vout is higher than the previously established reference voltage source for the load, a narrower width PWM signal is generated in PWM controller 51, and the output voltage is lowered.

When output voltage Vout is lower than the previously established reference voltage source for the load, a wide-width PWM signal is generated in PWM controller 51, and the output voltage Vout is elevated.

Therefore, the switching operation in voltage suppressing portion 3 is controlled according to the level of the output voltage Vout supplied to the load, and a stable reference output voltage Vout is consistantly supplied to the load.

However, there is a large amount of power consumption in FET1 caused by monotonously switching on and off. This excessive consumption also creates excessive heat. Thus, the conventional voltage-suppressed voltage source is somewhat inefficient.

Furthermore, a radiator or cooling apparatus for FET1 is indispensable in such an electric device, which takes up space and can also create a requirement for an even higher-rated voltage source.

SUMMARY OF THE INVENTION

It is therefore an object of the present invention to provide a high performance voltage-suppressed voltage source using a partial resonance circuit to reduce power consumption by diminishing the current in the switching device while switching 'on' and 'off'.

When the first switching device of the voltage suppressing portion turns off from on, the DC voltage from the output terminal of the DC voltage generating portion is accumulated to the resonance capacitor. Therefore, when the first switching device of the voltage suppressing portion is again turned off, the power loss is minimized due to the fact that there is no current flowing to the first switching device. Because the resonance capacitor is charged, the resonance current flows to the resonance coil through the second switching device before the first switching device of the voltage suppressing portion is turned on from off.

The created resonance current is transmitted to the voltage suppressing portion so that the direction of current is the same as the direction when the first switching device is 'on'. Thus, the power consumption is minimized while the first switching device is turned on.

BRIEF DESCRIPTION OF THE DRAWINGS

A further understanding of the nature and advantages of the present invention will become apparent by reference to the remaining portion of the specification and drawings from FIG. 2 to FIG. 5.

FIG. 3a shows a waveform of a PWM signal output from the PWM controller 400 in FIG. 2;

FIG. 3b shows a delayed version of the PWM signal in FIG. 3a;

FIG. 3c shows a waveform of a trigger pulse signal output from trigger pulse signal generating portion 610 in FIG. 2;

FIG. 3d shows a waveform of the current flow through FET11 in FIG. 2;

FIG. 3e shows a waveform of current I3 in FIG. 2;

FIG. 3f shows a waveform of resonance current I4 in FIG. 2;

FIG. 3g shows a waveform of current I2 in FIG. 2;

FIG. 3h shows a waveform of current I5 in FIG. 2;

FIG. 5a shows a waveform of a PWM signal in the PWM control portion 400 of FIG. 4;

FIG. 5b shows a waveform of an induced signal in the second coil T15 of FIG. 4;

FIG. 5c shows a waveform of a PWM signal applied to the gate of FET13 in FIG. 4;

FIG. 5d shows a waveform of an induced signal in second coil T13 of FIG. 4;

FIG. 5e shows a waveform of a delayed PWM signal of FIG. 4; and

FIG. 5f shows a waveform of a delayed PWM signal as applied to the gate of FET11 in FIG. 4.

DETAILED DESCRIPTION OF THE PREFERRED EMBODIMENTS

Figure 1:
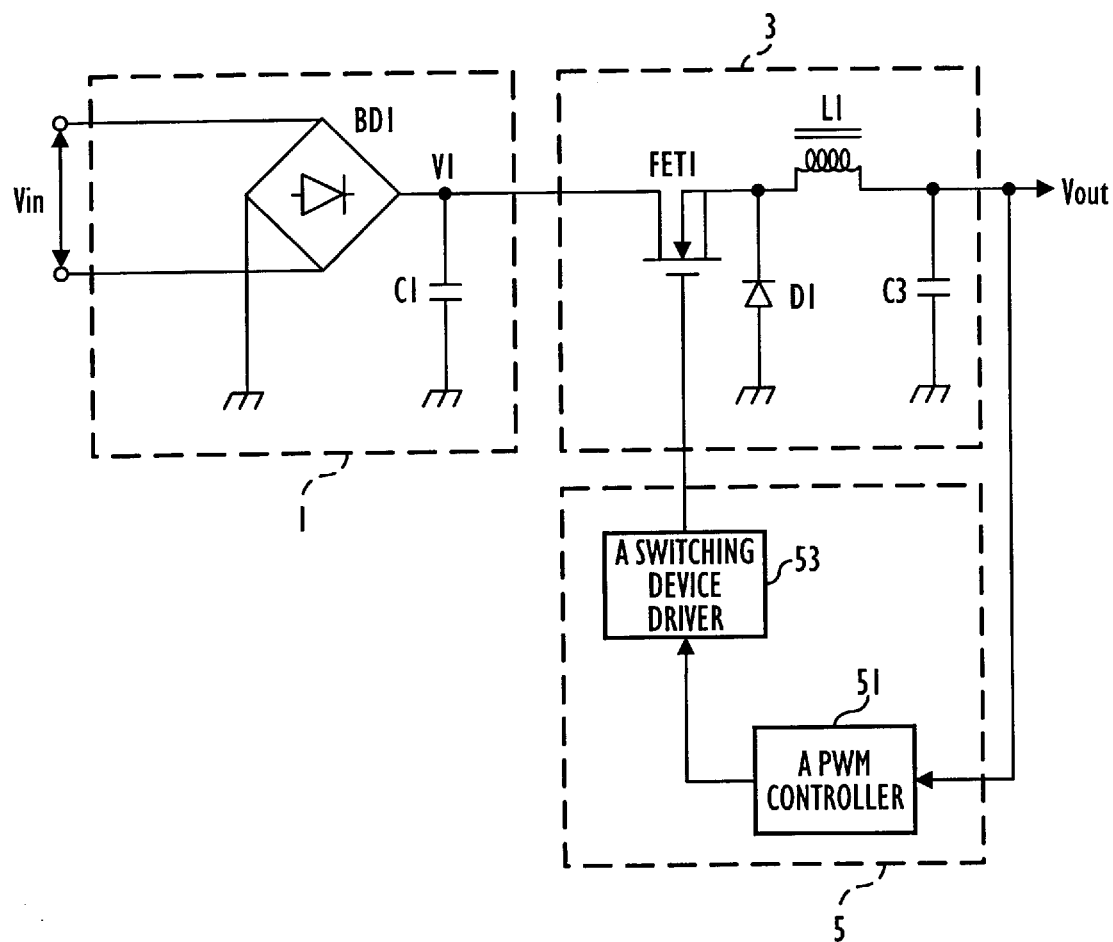
FIG. 1 is a circuit diagram showing a conventional voltage-suppressed voltage source.
Figure 2:
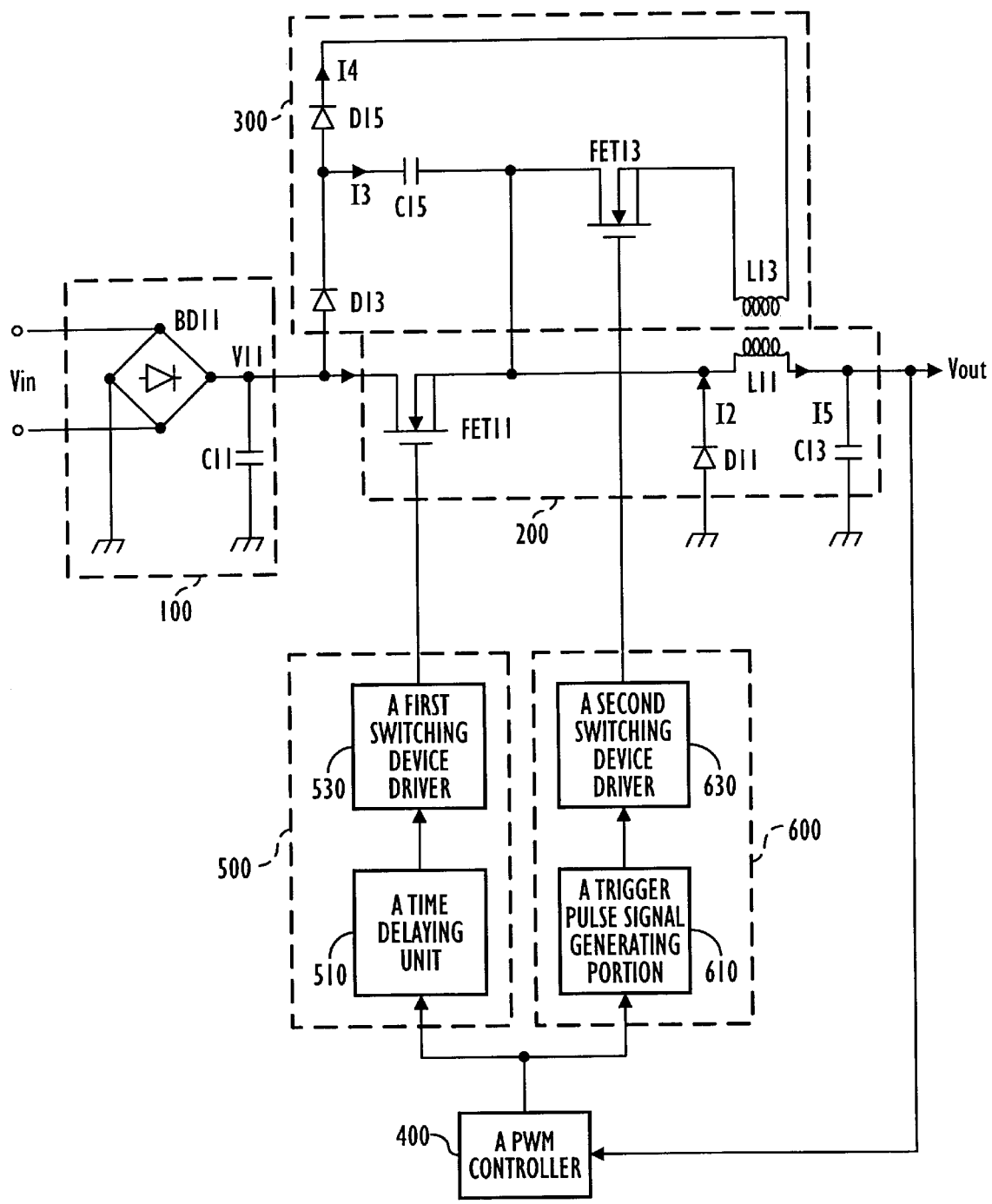
FIG. 2 is a circuit diagram showing a voltage-suppressed voltage source according to the present invention.

FIG. 2 is a circuit diagram showing a voltage-suppressed voltage source in accordance with a preferred embodiment of the present invention. As shown in FIG. 2, DC voltage generating portion 100 converts an input voltage Vin to an arbitrary DC voltage V11. Input voltage Vin is input to the bridge diode BD11, while the output node of the bridge diode BD11 is connected to a capacitor C11.

Voltage suppressing portion 200 switches and suppresses the DC voltage V11 from the DC voltage generating portion 100 according to the control signal of the first switching control portion 500 which will be explained later, to adjust the DC voltage level, and to supply the voltage to the load.

In the voltage suppressing portion 200, DC voltage V11 from DC voltage generating portion 100 flows to the drain of FET11 which is working as the first switching device. The source of FET11 is tied to the cathode of flywheel diode D11 and one node of coil L11. The anode of flywheel diode D11 is connected to ground. The other node of the coil L11 is tied to the capacitor C13, where the output voltage Vout occurs.

Partial resonance portion 300 is resonated according to the control signal of the second switching control portion 600, and is used for lessening the power loss on FET11. The output terminal of the DC voltage generating portion 100 is tied to one node of resonance capacitor C15 through diode D13. The other node of resonance capacitor C15 is tied to the drain of FET13, which functions as the second switching device. The source of FET13 is tied to one node of resonance coil L13 which forms a coupled inductor with coil L11. The cathode of diode D13 and capacitor C15 are tied to the other node of resonance coil L13 through diode D15.

PWM controller 400 supplies a variable-width PWM signal according to the level of the output voltage Vout supplied to the load.

First switching control portion 500 delays the PWM signal generated by PWM controller 400 and controls the on and off switching of FET11 in the voltage suppressing portion 200. The first switching control portion 500 is preferably composed of a time delaying unit 510 which delays the PWM signal of PWM controller 400, and switching device driver 530 which controls and applies the output signal of time delaying portion 510 to the gate of FET11.

Second switching control portion 600 controls FET13 in the partial resonance portion 300 according to the PWM signal of the PWM controller 400. The second switching control portion 600 is preferably composed of a trigger signal generating portion 610 which produces a trigger signal according to the PWM signal from the PWM controller 400, and a switching device driver 630 which controls the level of the trigger signal from the trigger signal generating portion 610 and supplies the signal to the gate of FET13.

In this embodiment, the input voltage is rectified through the bridge diode BD11 in the DC voltage generating portion 100, and is flattened through the capacitor C11. Therefore, if the input voltage Vin is a DC voltage, it will be transferred directly through bridge diode BD11 and capacitor C11. However, if input voltage Vin is an AC voltage, it is rectified through bridge diode BD11, flattened through capacitor C11, and transformed into a DC voltage V11.

DC voltage V11 is switched and suppressed by FET11 in voltage suppressing portion 200, transformed into the output DC voltage through flywheel diode D11, coil L11, and capacitor C13, and finally, is supplied to the load as an output voltage.

The output voltage is fed back to PWM controller 400, and PWM controller 400 generates a variable-width PWM signal according to the level of the output voltage Vout. That is, PWM controller 400 generates a PWM signal with narrow width when the level of the output voltage Vout is higher than the previously established reference voltage. On the other hand, PWM controller 400 generates a PWM signal with wide width when the level of Vout is lower than the previously established reference voltage.

Figures 3A, 3B, 3C, 3D, 3E, 3F, 3G, 3H:
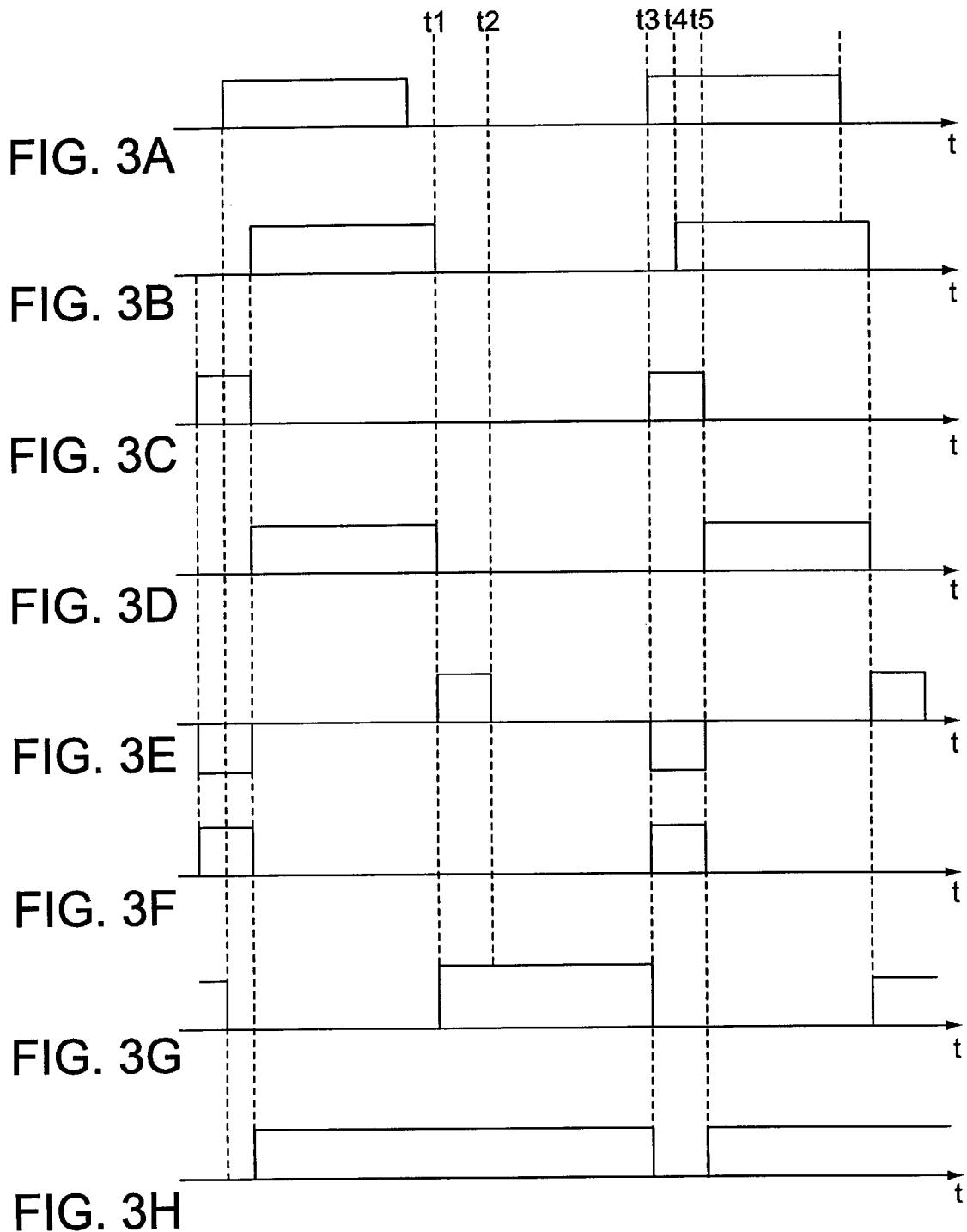

FIGS. 3a–3h show waveforms at various locations in the circuit of FIG. 2. In this example, PWM controller 400 generates a PWM signal as indicated in FIG. 3a. The PWM signal from PWM controller 400 is then delayed for a certain amount of time in time delaying unit 510 as shown in the FIG. 3b. FET11 is then driven by the delayed PWM signal through the first switching device driver 530.

If the delayed PWM signal is high, FET11 is on, and current flows as shown in FIG. 3d. The DC signal passing through FET11 is then stored in coil L11, and current I5 flows from coil L11 as shown in FIG. 3h. Then, the voltage is flattened through capacitor C13, and is supplied to the load as an output voltage.

Meanwhile, if the delayed PWM signal is low, FET11 will be off, and current will not flow through FET11. In that situation, the forward bias is applied to flywheel diode D11 due to the fact that a counter-electromotive force is given to coil L11. Thus, the voltage stored in coil L11 will start to be discharged toward the capacitor C13 since flywheel diode D11 is turned on and a closed loop is established comprising flywheel diode D11, coil L11, and capacitor C13.

FIG. 3g illustrates current I2 flowing to flywheel diode D11. Thus, current I5 will keep flowing to coil L11, and output voltage Vout will maintain its level as before.

The voltage level of the common node between the source of FET11 and resonance capacitor C15 in the partial resonance portion 300 will be low due to FET11 being off and flywheel diode D11 being turned on. Then, current I3 as shown in the FIG. 3e, will start to flow and resonance capacitor C15 will capture the current.

If capacitor C15 is fully charged at time t2, then current I3 will no longer flow. Therefore, if FET11 is off, current I1 will not flow to FET11, and the charge from current I1 will be retained in capacitor C15. This operation minimizes power loss on FET11. In this condition, at time t3, when PWM controller 400 provides a PWM signal as shown in FIG. 3a, the signal will be an input to the trigger pulse signal generating portion 610 of second switching control portion 600, and trigger pulse signal generating portion 610 will generate a trigger pulse signal with a width of t3–t5 as shown in FIG. 3c.

The voltage level of the trigger pulse signal will be controlled in second switching device driver 630, and it will be applied to the gate of FET13 in partial resonance portion 300. At time t3, FET13 is on, and a closed loop comprising resonance capacitor C15, diode D15, resonance coil L13 and FET13 will be established. Therefore, the charge on the resonance capacitor C15 is discharged as shown in FIG. 3e, and a resonance current I4 will flow as shown in FIG. 3F to diode D15, resonance coil L13, and FET13. Then, resonance capacitor C15 and resonance coil L13 will be resonated.

Resonance current I4 flows to the resonance coil L13, and via counter-electromotive force, suppresses current I2, which flows through flywheel diode D11 and coil L11. In this condition, the PWM signal created in the PWM control portion 300 is delayed for a while in the time delaying portion 510 and is output at time t4, as shown in FIG. 3b. The delayed PWM signal is applied to the gate of FET11 through the first switching device driver 530 so that FET11 will be on.

In summary, the counter electromotive force induced by the resonance current I4 flowing to resonance coil L13 prevents current I2 from flowing to flywheel diode D11, so that FET11 will be on. Therefore, the fact that current I1, which flows to FET11 is minimized, also minimizes the power consumption in FET11.

On the other hand, when FET11 is off, resonance capacitor C15 will capture current I3. This results in cutting off current I1 through FET11 so that power consumption in FET11 is minimized.

Before FET11 is turned on, FET13 will be on, and the current to flywheel diode D11 is cut off. If FET11 is on, FET13 will be off, and power consumption will therefore be minimized.

Figure 4:
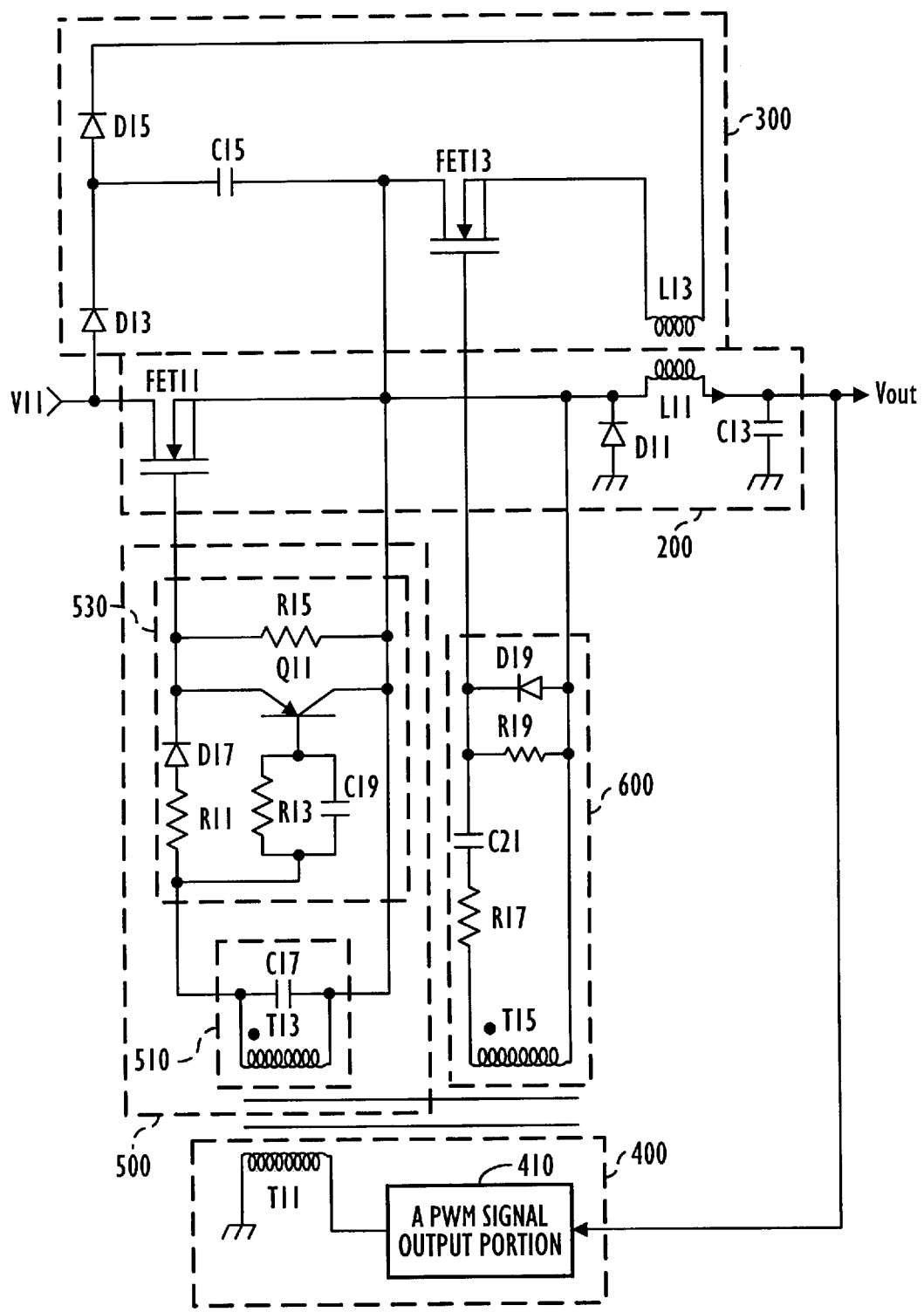
FIG. 4 is a detailed circuit diagram showing real examples of the first and second switching control portion in FIG. 2.

FIG. 4 is a detailed circuit diagram showing an embodiment of the first and second switching control portions 500, 600 in the voltage-suppressed voltage source. In PWM controller 400, first coil T11 of the coupled inductor is tied to the output node of PWM signal output portion 410, which generates a PWM signal through the feedback of the output voltage Vout. Delay capacitor C17 is connected in parallel to second coil T13, which is coupled to first coil T11 of the coupled inductor.

In the first switching device driver 530, second coil T13 and capacitor C17 are connected in parallel between the collector of transistor Q11 and resistor R11, which connects to diode D17 which connects to the emitter of the transistor Q11. The emitter of transistor Q11 is also tied to one node of resistor R15, and the gate of FET11. Capacitor C17 and second coil T13 are also connected to the base of the transistor Q11 through resistor R13 and capacitor C19 in parallel. Resistor R15, the sources of FET11 and FET13, resonance capacitor C15, and the cathode of the flywheel diode D11, are all tied to the collector of Q11 as well.

In the second switching device control portion 600, one node of the second coil T15, which is coupled to the first coil T11, is connected to the series combination of resistor R17 and the capacitor C21. The remaining lead of capacitor C21 is tied to one node of resistor R19, the cathode of diode D19, and the gate of FET13. The other node of second coil T15 is tied together to the other node of the resistor R19, the anode of diode D19, the source of FET11 and FET13, resonance capacitor C15 and the cathode of flywheel diode D11.

As shown in FIG. 5a, this embodiment generates a PWM signal in the PWM control portion 400 at time t11, according to the level of output voltage Vout. Then, the PWM signal is applied to first coil T11 of the coupled inductor.

The PWM signal applied to first coil T11 will induce a signal in second coil T15 as shown in FIG. 5b. FET13 will be on as the induced PWM signal passes through resistor R17, the signal is differentiated through capacitor C21 and resistor R17, and the negative differential signal is removed through diode D19. This way, the PWM signal is applied to the gate of FET13 as shown in FIG. 5c.

Therefore, the resonance current flows to the resonance coil L13 through the voltage source charged in resonance capacitor C15, and the counter electromotive force is induced to coil L11 through the resonance current flowing to resonance coil L13.

The PWM signal of first coil T11 will induce a signal in second coil T13 as shown in FIG. 5d. The PWM signal induced in second coil T13 generates the other PWM signal at time t12 after having been delayed for a certain amount of time Δt through capacitor C17 as shown in FIG. 5e.

The delayed PWM signal first passes through resistor R11 of first switching device driver 530 and diode D17, and then is applied to the gate of FET11 in the voltage suppressing portion 200 as shown in FIG. 5f. Therefore, FET11 is turned on, and the DC voltage V11 from the DC voltage generating portion 100 passes through FET11, and is transferred to the output voltage Vout through coil L11 and capacitor C11.

Meanwhile, as a high voltage is applied to the base of transistor Q11, transistor Q11 will be off. In this condition, at time t13, the voltage through time delaying unit 510 is low, and the low voltage is applied to the base of Q11 to turn on Q11. Then, the voltage on the gate of FET11 is low, and FET11 is off.

As has been explained above, the present invention basically eliminates the cause of excessive power consumption while the switching device turns on and off. Hence, it reduces the power consumption and heat produced by the switching device. Consequently, the size of the radiator that cools the switching device can be reduced.

As only preferred embodiments of the invention have been described herein, it will be apparent to those of skilled in the art that other modifications may be made within the scope of the invention, and it is intended that the full measure of the invention be determined with reference to the appended claims.

What is claimed is:

1. A voltage-suppressed voltage source for supplying an output voltage comprising:

a DC voltage generating portion for producing an arbitrary DC voltage;

a suppressor circuit having a first switching device which switches between an on state and an off state, and suppressor circuit receiving said arbitrary DC voltage and transforming said arbitrary DC voltage into said output voltage;

a PWM controller for monitoring said output voltage, and generating a PWM signal based on the voltage level of said output voltage;

a first switching control portion for receiving said PWM signal from said PWM controller and controlling said first switching device by outputting a delayed version of said PWM signal to said first switching device;

a second switching control portion for generating a trigger pulse signal according to said PWM signal from said PWM controller; and a partial resonance portion having a second switching device controlled according to said trigger pulse signal, and for reducing current flow to said first switching device when said first switching device switches between said on and off states.

2. A voltage-suppressed voltage source according to claim 1, wherein said first switching control portion delays said PWM signal, and said trigger pulse signal causes said second switching device to be on before said first switching device is on and said second switching device to be off after said first switching device is turned on.

3. A voltage-suppressed voltage source according to claim 1, wherein said first switching control portion comprises:

a time delay unit for delaying said PWM signal from said PWM controller; and a first switching device driver for inputting said delayed PWM signal from said time delay unit and outputting a signal representing said inputted PWM signal at an appropriate output level.

4. A voltage-suppressed voltage source according to claim 3, wherein said time delay unit comprises:

a coupled inductor for receiving said PWM signal from said PWM controller; and a capacitor connected to said coupled inductor for receiving and delaying said PWM signal before said delayed PWM signal is output to said first switching device.

5. A voltage-suppressed voltage source according to claim 1, wherein said second switching control portion comprises:

a trigger pulse generating portion for providing a trigger pulse according to said PWM signal from said PWM controller; and a second switching device driver for controlling said second switching device according to the output level of said trigger pulse generating portion.

6. A voltage-suppressed voltage source according to claim 1, wherein said second switching control portion comprises:

a coupled inductor for receiving said PWM signal from said PWM controller;

a differentiator for differentiating said PWM signal received by said coupled inductor, said differentiator generating at least a positive differential signal; and a diode for minimizing negative differential signals of said differentiator, so that said positive differential signal is applied as said trigger pulse signal to said second switching device.

7. A voltage-suppressed voltage source according to claim 1, wherein said partial resonance portion comprises:

a resonance capacitor for storing said arbitrary DC voltage when said first switching device is off, thereby preventing current from flowing into said first switching device, said resonance capacitor discharging when said second switching device is on; and a coupled inductor for transmitting a discharging current of said resonance capacitor to said voltage suppressing portion, thereby temporarily opposing current flow from said first switching device when said first switching device is turned on;

wherein said second switching device turns on before said first switching device turns on, and said second switching device controls the discharging of the voltage stored in said resonance capacitor.

* * * * *